United States Patent
Bardus et al.

(10) Patent No.: US 6,183,686 B1
(45) Date of Patent: Feb. 6, 2001

(54) SPUTTER TARGET ASSEMBLY HAVING A METAL-MATRIX-COMPOSITE BACKING PLATE AND METHODS OF MAKING SAME

(75) Inventors: Steven L. Bardus, Westerville; Sohail S. Qamar, Powell; Anurag Bansal, Gahanna, all of OH (US)

(73) Assignee: Tosoh SMD, Inc., Grove City, OH (US)

( * ) Notice: Under 35 U.S.C. 154(b), the term of this patent shall be extended for 0 days.

(21) Appl. No.: 09/365,919

(22) Filed: Aug. 3, 1999

Related U.S. Application Data

(60) Provisional application No. 60/095,250, filed on Aug. 4, 1998.

(51) Int. Cl.$^7$ .................................. B22F 3/14; B22F 7/04
(52) U.S. Cl. ..................................... 419/8; 419/17; 419/49
(58) Field of Search ....................................... 419/8, 17, 49

(56) References Cited

U.S. PATENT DOCUMENTS

| | | |
|---|---|---|
| 3,620,957 | 11/1971 | Crawley et al. . |
| 3,936,277 | 2/1976 | Jakway et al. . |
| 4,135,286 | 1/1979 | Wright et al. . |
| 4,135,922 | 1/1979 | Cebulak . |
| 4,209,375 * | 6/1980 | Gates et al. ................... 204/192 R |
| 4,564,401 | 1/1986 | Strichman et al. . |
| 4,663,120 | 5/1987 | Parent et al. . |
| 4,750,932 | 6/1988 | Parent et al. . |
| 4,811,892 | 3/1989 | Kunzmann et al. . |
| 5,160,675 | 11/1992 | Iwamoto et al. . |
| 5,167,920 | 12/1992 | Skibo et al. . |
| 5,215,639 | 6/1993 | Boys . |
| 5,230,459 | 7/1993 | Mueller et al. . |
| 5,268,236 | 12/1993 | Dumont et al. . |
| 5,294,321 | 3/1994 | Satou et al. . |
| 5,320,729 | 6/1994 | Narizuka et al. . |
| 5,333,726 | 8/1994 | Makowiecki et al. . |
| 5,334,267 | 8/1994 | Taniguchi et al. . |
| 5,354,446 | 10/1994 | Kida et al. . |
| 5,397,050 | 3/1995 | Mueller . |
| 5,409,517 | 4/1995 | Satou et al. . |
| 5,415,829 | 5/1995 | Ohhashi et al. . |
| 5,418,071 | 5/1995 | Satou et al. . |
| 5,439,500 | 8/1995 | Marx . |
| 5,447,616 | 9/1995 | Satou et al. . |
| 5,460,793 | 10/1995 | Kano et al. . |
| 5,464,520 | 11/1995 | Kano et al. . |
| 5,480,531 | 1/1996 | Weigert et al. . |
| 5,480,532 | 1/1996 | Schlott et al. . |
| 5,531,948 | 7/1996 | Schlott et al. . |
| 5,618,397 | 4/1997 | Kano et al. . |
| 5,656,216 * | 8/1997 | Lo et al. ........................... 264/113 |
| 5,672,425 * | 9/1997 | Sato et al. ......................... 428/332 |
| 5,693,203 | 12/1997 | Ohhashi et al. . |
| 5,836,506 * | 11/1998 | Hunt et al. ........................ 228/172 |
| 5,857,611 * | 1/1999 | Gilman et al. .................... 228/193 |
| 5,879,524 * | 3/1999 | Hurwitt et al. ................. 204/298.12 |
| 5,944,963 * | 8/1999 | Ruppel et al. ................. 204/192.23 |
| 5,963,778 * | 10/1999 | Stellrecht ........................... 428/554 |
| 6,042,777 * | 3/2000 | Lo et al. ............................... 419/8 |

OTHER PUBLICATIONS

Haji-Mahmood, M.S. and Chumbley, L.S., "Processing and Characterization of Nanocrystalline Molybdenum Disilicide Consolidated by Hot Isostatic Pressing (HIP)," 1996, *Nano-Structural Materials*, vol. 7, Nos. 1/2, pp. 95–112.

"DWA Aluminum Composites", *Company Profile DRA Products Catalogue*, Fall 1996.

* cited by examiner

*Primary Examiner*—Daniel J. Jenkins
(74) *Attorney, Agent, or Firm*—Biebel & French

(57) ABSTRACT

A method of producing a sputter target assembly including a metal target attached to a metal-matrix-composite backing plate and sputter target assemblies made thereby. The method includes hot isostatically pressing a silicon carbide-aluminum powder composition to form a backing plate while simultaneously bonding the powder composition to a metal target to form a diffusion-type bond between the target and the backing plate such that the target assembly possesses extremely high resistance to warpage at high operating temperatures. A second embodiment of the sputter target assembly includes an annular sealing member of machined aluminum disposed in the backing plate around the target.

8 Claims, 4 Drawing Sheets

US 6,183,686 B1

SPUTTER TARGET ASSEMBLY HAVING A METAL-MATRIX-COMPOSITE BACKING PLATE AND METHODS OF MAKING SAME

PRIOR PROVISIONAL APPLICATION

Applicant claims the benefit of the filing date of Provisional Application Ser. No. 60/095,250, filed Aug. 4, 1998.

BACKGROUND OF THE INVENTION

The present invention pertains to a design and a method of manufacturing sputter target assemblies for magnetron sputter thin film coating processes.

Sputtering targets attached to aluminum or copper based backing plates are used to deposit thin films on substrates for semiconductor device manufacturing. These target assemblies provide mechanical and electrical attachment of the target material to the sputter apparatus, provide vacuum sealing surfaces to maintain proper chamber environment, and typically provide a path of heat removal for effective cooling of the target material during sputter deposition.

Until now, copper or aluminum backing members fulfilled these functions adequately. Recently, however, target assembly designs have increased in size, typically by 30%. During operation, traditional copper and aluminum materials do not provide enough mechanical strength to prevent excessive deformation of the target assembly which results in poor deposited film quality and may stress the target-to-backing member joint to the breaking point. Accordingly, there is a need for sputter target assemblies having increased deflection resistance with strong target-to-backing member joint strength, vacuum-capable sealing surfaces, and high heat conductivity.

SUMMARY OF THE INVENTION

The sputter target assembly of the invention comprises a target selected from the group consisting of aluminum, copper, titanium, and alloys thereof; and a backing plate comprising a metal-matrix-composite (MMC) material. In one embodiment of the sputter target assembly, the metal-matrix-composite backing plate is made of silicon carbide impregnated aluminum. The silicon carbide may be in the form of particles, fibers, or mesh.

A method of making the sputter target assembly of the invention includes the steps of providing a target material, placing the target material in a hot isostatic press (HIP) can, blending aluminum or aluminum alloy powders with silicon carbide powders to a specific ratio, placing the blended powders in the HIP can in contact with the target material, sealing the HIP can, evacuating the can, and subjecting the can to hot isostatic pressing. This process results in a fully joined assembly wherein the target material is bonded in-situ to the silicon carbide impregnated aluminum backing material.

It is an object of the invention to provide a sputter target assembly capable of withstanding high temperature stress with minimal warpage or deformation of the sputter target assembly.

It is another object of the invention to provide a sputter target assembly having a backing plate comprised of metal-matrix-composite material.

Other objects and advantages of the invention will be apparent from the following description, the accompanying drawings and the appended claims.

DETAILED DESCRIPTION OF THE PREFERRED EMBODIMENT

Figure 1:
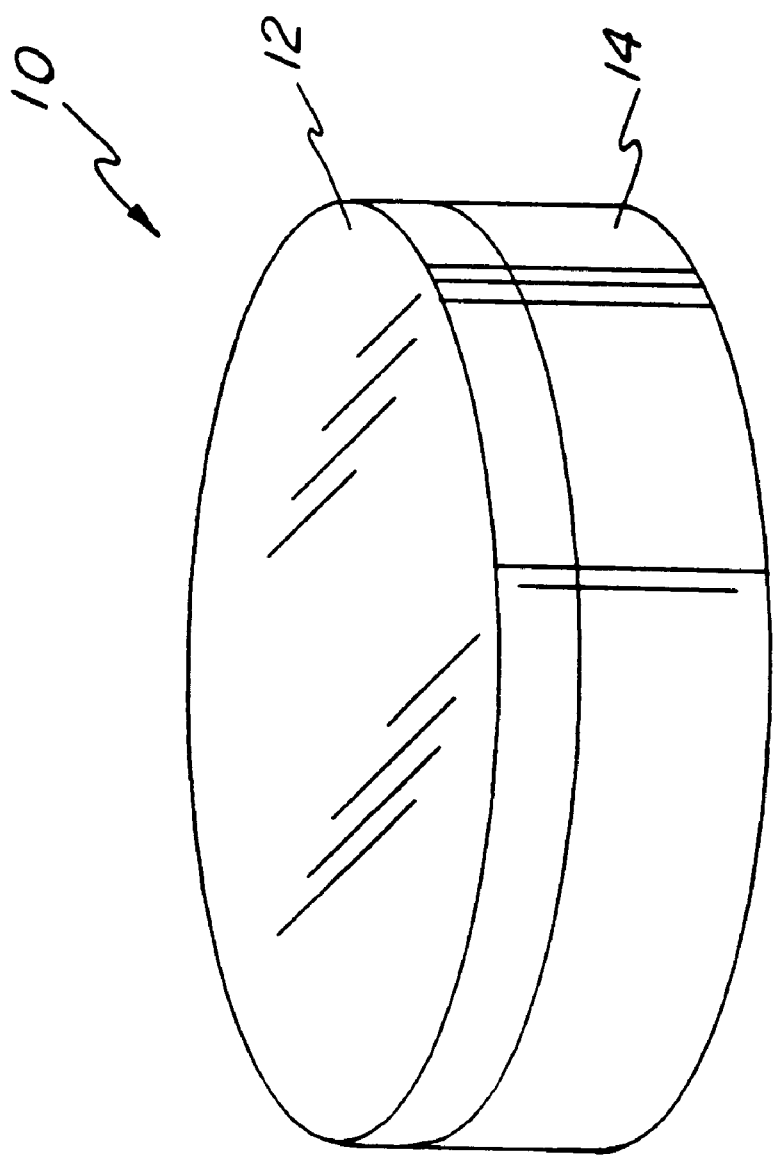
FIG. 1 shows a first embodiment of a sputter target assembly made in accordance with the present invention.

Referring to FIG. 1, a sputter target assembly 10 includes a target 12 which is bonded to a backing plate 14. The target plate 12 may be made of aluminum, aluminum alloy, copper, copper alloy, titanium, or titanium alloy. The backing plate 14 may be made of aluminum or aluminum alloy impregnated with silicon carbide particles, silicon carbide fibers, or silicon carbide mesh. The bond between the target 12 and the backing plate 14 is of the diffusion type wherein the target plate 12 is joined to the backing plate 14.

With reference to FIGS. 2–5, a method of producing the sputter target assembly 10 of the present invention comprises placing a target plate 12 within a HIP can 20. The target plate 12 preferably includes a freshly machined flat lower surface facing upwardly within the can 20.

Figure 2:
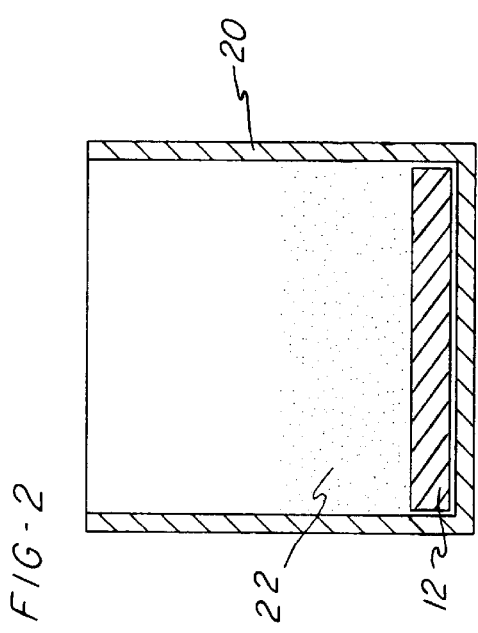

The target plate 12 is overlaid with a leveled out blended powder composition 22 as is illustrated in FIG. 2. The powder is preferably a composition of aluminum or aluminum alloy impregnated with silicon carbide particles. Silicon carbide fibers or mesh may also be used. Preferably, the blended powder composition 22 comprises about 99–24 vol. % aluminum or aluminum alloy with the remainder being silicon carbide particles having a size of from about 1 micron to about 50 microns preferably 2 to 25 microns.

Figure 3:
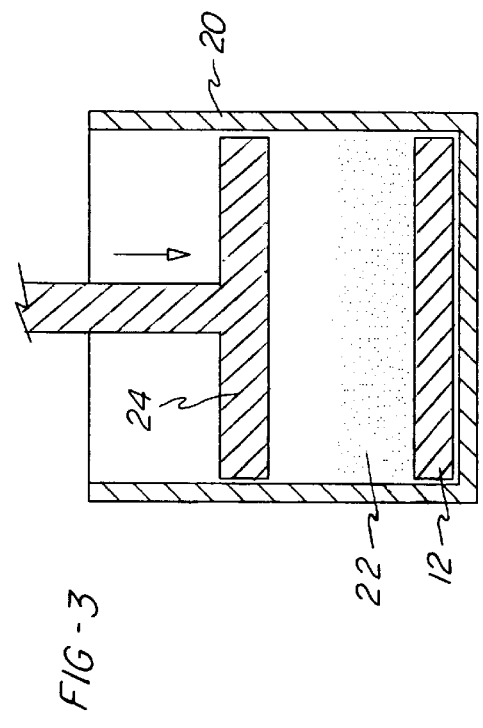
FIGS. 2–5 diagrammatically illustrate a series of steps performed in accordance with the invention for making the sputter target assembly of FIG. 1.

A pressing punch 24 is then inserted into the can 20 above the powder 22 and the powder 22 is compacted in a ram-type press at room temperature until the powder 22 is compressed to at least 50% of its final density as shown in FIG. 3. It should be noted that the initial thickness of the aluminum-silicon carbide powder layer is selected such that it is adequate to obtain the desired fmal full density thickness at the conclusion of the target assembly forming process.

Figure 4:
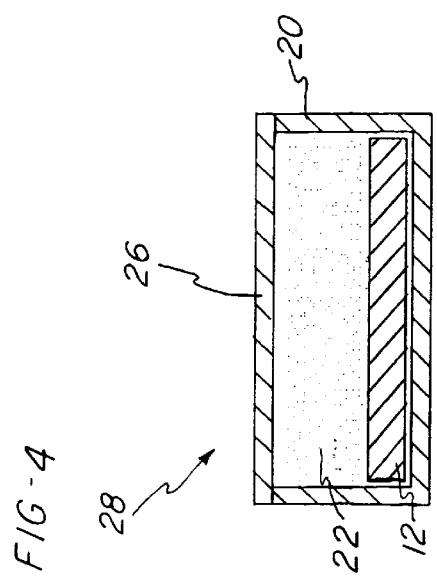

After the initial compaction of the powder 22, a top closure plate 26 is welded onto the can 20 to form a can assembly 28 defining a vacuum tight closure, as shown in FIG. 4. Further, residual air is removed from the interior of the can assembly 28 through a tube attached thereto (not shown).

Next, the can assembly 28 is subjected to a HIP process at a predetermined temperature and pressure for a selected time period. The particular conditions used for the HIP process are selected to meet the final backing material requirement as well as to achieve a sound bond between the powder composition forming the backing plate 14 and the target plate 12. In a preferred HIP process, the can assembly 28 may be subjected to a temperature of about 600° C. and a pressure of 15,000 ksi for a time period of 2 hours.

Figure 5:
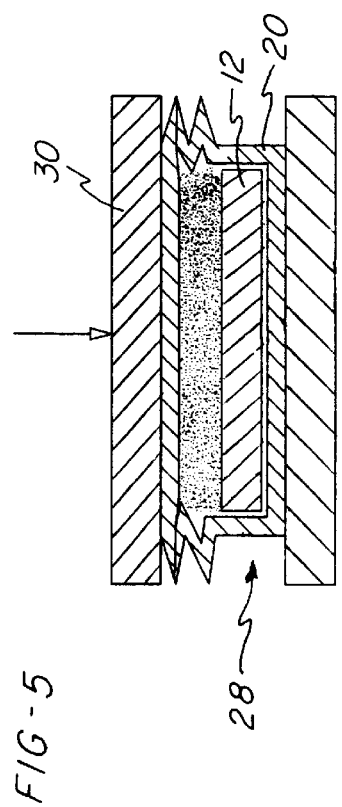

After the HIP process has been completed, the HIP can assembly 28 is placed in a platen press 30 to press the can assembly 28 to a desired flatness as is shown in FIG. 5.

Finally, the flattened assembly may then be machined by conventional means to desired dimensions for the final target assembly 10.

During the consolidation of the powder composition 22, the target plate 12 undergoes a reduction in diameter as a result of being drawn radially inwardly by the silicon carbide impregnated powder composition 22 as it contracts and increases in density. The surface straining that occurs during this phase of operation aids in producing a sound metallurgical bond between the target 12 and the backing plate 14.

By producing a diffusion bond between the target 12 and the backing plate 14 with the target 12 and the backing plate 14 having closely matched thermal expansion rates, the final target assembly 10 has an enhanced strength and high operating temperature capability, and thus is operable over a wide range of sputtering power levels.

Figure 6:
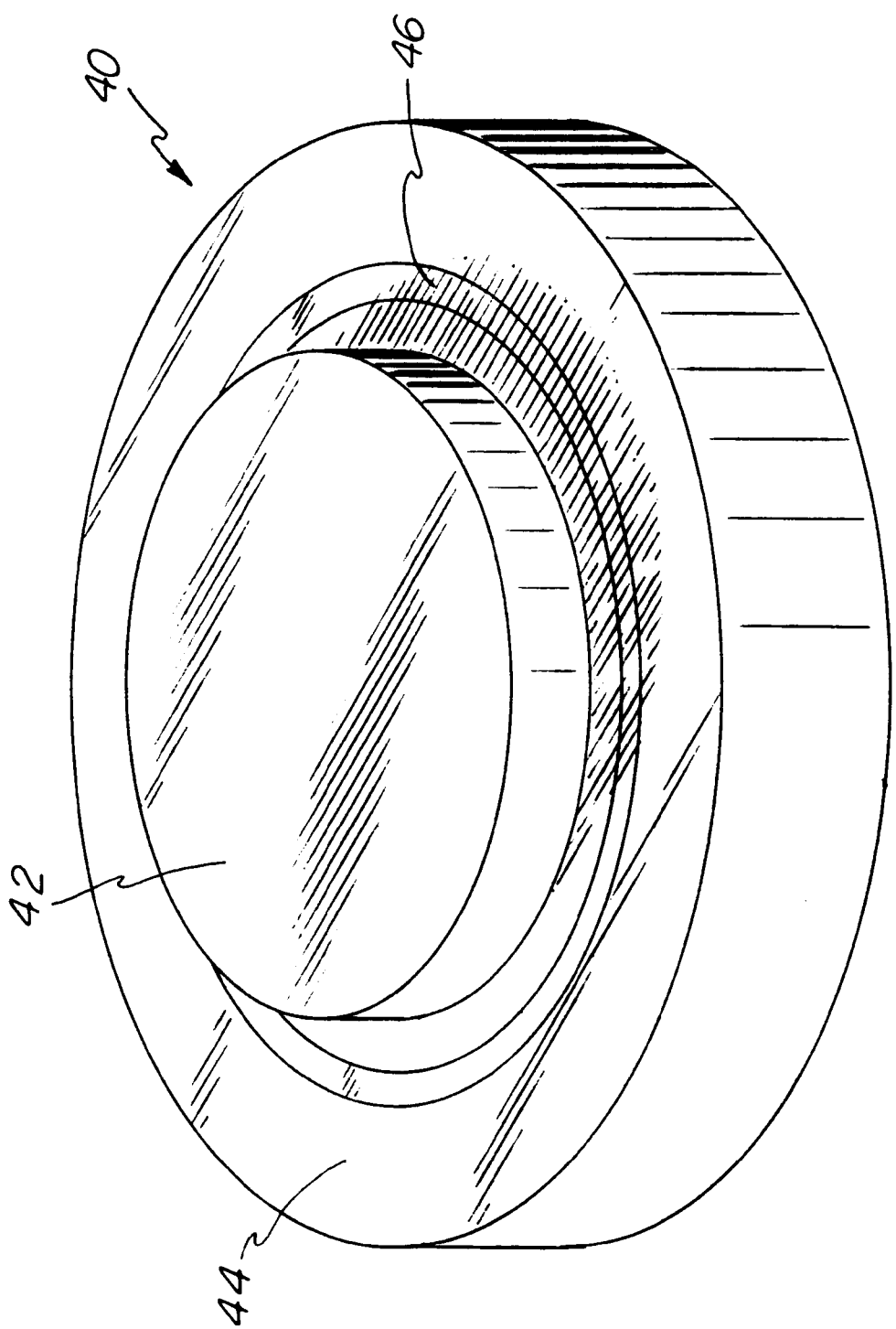
FIG. 6 shows a second embodiment of the sputter target assembly of the invention.

Referring to FIG. 6, a second embodiment 40 of the sputter target assembly of the invention is shown. In addition to a target 42 bonded to a backing plate 44, the sputter target assembly 40 includes a sealing member 46 embedded in a top surface of the backing plate 44. The backing plate 44 has a greater diameter than the target 42 and the target 42 is centered coaxially on the backing plate 44 so that an annular portion of the backing plate 44 extends radially outwardly from the target 42. The sealing member 46 forms an annular air-tight seal around the target 42 in cooperation with a sealing edge of a vacuum chamber (not shown).

As with the first embodiment, the target 42 may be formed of aluminum, copper, or titanium, or alloys thereof. The backing plate 44 may be made of a metal matrix composite material such as aluminum or aluminum alloy with silicon carbide particles, fibers, or mesh distributed uniformly throughout.

Referring now to FIGS. 7–10, a method of producing the second embodiment 40 of the sputter target assembly of the invention may be seen. A target 42 composed of a desired material to be sputtered is placed in a HIP can 50. The target plate 42 preferably includes a freshly machined flat bottom surface facing upwardly within the can 50.

A sealing member 46 formed as an annular ring of machined aluminum or aluminum alloy is placed in the HIP can 50 concentric with the target 42. Of course, the sealing member 46 may have other shapes, or be located off-center with respect to the target 42, if desired.

Figure 7:
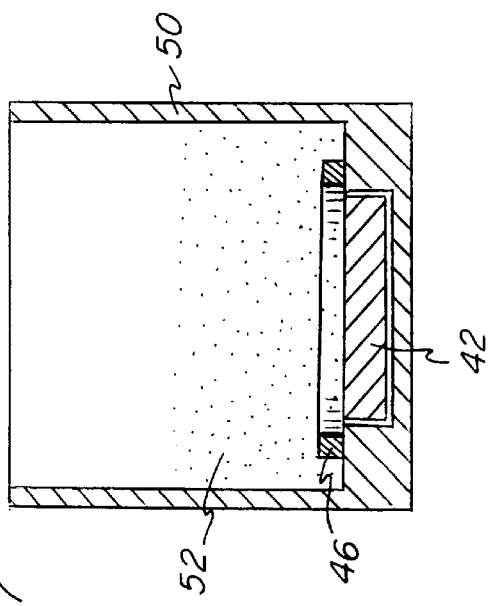
FIGS. 7–10 diagrammatically illustrate a series of steps performed in accordance with the invention for making the sputter target assembly of FIG. 6.

A blended powder composition 52 of metal matrix composite such as aluminum or aluminum alloy powder and silicon carbide particles or fibers is placed in the can 50 covering the target 42 and sealing member 46 and leveled as shown in FIG. 7. Alternatively, silicon carbide mesh may be used by layering the mesh and aluminum powder over the target 42 and sealing member 46. Preferably, the powder composition 52 comprises about 99–45 vol % aluminum or aluminum alloy with the remainder being silicon carbide particles having a particle size of from about 1 micron to about 50 microns.

Figure 8:
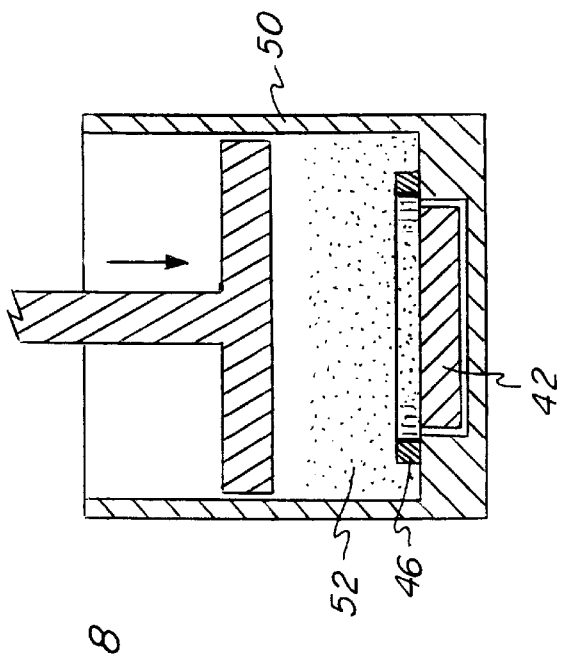

A press punch 54 is then inserted into the HIP can 50 above the powder 52 and sealing member 46 and the powder 52 is compacted in a ram-type press at room temperature until the powder 52 is compressed to at least 50% of its final density as shown in FIG. 8. As before, the quantity of powder composition 52 deposited over the target 42 and sealing member 46 is such that it is adequate to realize the final full density thickness of the backing plate 44 at the conclusion of the target assembly 40 forming process.

Figure 9:
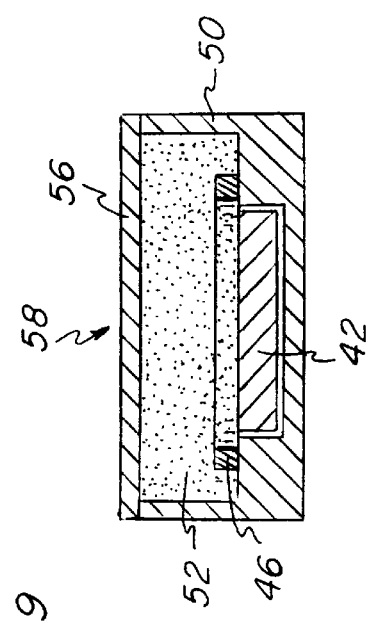
Figure 10:
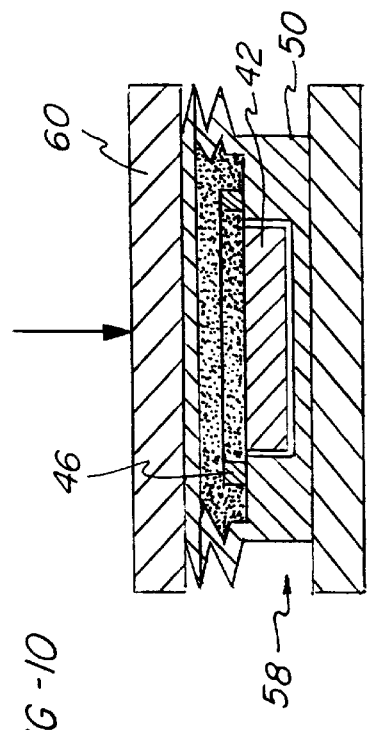

After initial compaction of the powder 52, a top closure plate 56 is welded onto the can 50 to form a can assembly 58 defining a vacuum tight closure, as shown in FIG. 9. Residual air is then removed from the can assembly 58 through an attached tube (not shown).

Next, the can assembly 58 is subjected to a HIP process at a predetermined temperature and pressure for a selected time period such as those set forth above.

Although the metal matrix composite material herein exemplified is a composite of Al or Al alloy with SiC material dispersed therein, the artisan will appreciate that a wide variety of metals and alloys may be chosen with a similar wide variety of reinforcing materials blended therein. These metal matrix composites are more fully described in U.S. Pat. No. 5,167,920 (Skibo et al.) incorporated by reference herein.

As to the Al materials, these may comprise Al or a wide range of alloys such as, 6061, 2024, 7075, 7079, and A356.

Additionally although the presently preferred method of manufacture includes a heat consolidation, preferably HIP-ing of the metal matrix composite (MMC) in powder form to the target material, the MMC can often be purchased in the form of a sheet like material that could in turn be heat and pressure bonded to the target such as by a hot press or the like.

While the methods herein described, and the products produced by these methods constitute preferred embodiments of this invention, it is to be understood that the invention is not limited to these precise methods and products, and that changes may be made in either without departing from the scope of the invention, which is defined in the appended claims.

What is claimed is:

1. A method of forming a sputter target assembly having a metal target bonded to a metal-matrix-composite backing plate comprising the steps of:

providing a target;

providing a metal matrix composite precursor composition;

subjecting said target and said precursor composition to a predetermined temperature and a predetermined pressure for a predetermined period of time to form said precursor composition into said metal matrix composite backing plate and to provide a bond between said target and said backing plate.

2. A method of forming a sputter target assembly having a metal target bonded to a metal-matrix composite backing plate, said method comprising the steps of:

providing a target plate;

providing a metal matrix composite precursor composition comprising Al or Al alloy and SiC material;

placing said target plate in a can;

placing said precursor composition in said can and in abutting relationship to said target plate;

pressure consolidating said precursor composition and said target plate to form said precursor composition into said metal matrix composite backing plate and to provide a bond between said target plate and said backing plate.

3. The method as recited in claim 2 wherein said pressure consolidation step is performed in a hot isostatic press process.

4. The method recited in claim 2 wherein said precursor composition comprises aluminum and silicon carbide powders.

5. The method recited in claim 2 further comprising the step of:

placing a sealing member in said can prior to said step of placing said precursor composition in said can.

6. The method as recited in claim 5 wherein said sealing member comprises a ring of machined aluminum or aluminum alloy.

7. The method as recited in claim 2 wherein said SiC material comprises SiC fibers.

8. The method as recited in claim 2 wherein said SiC material comprises SiC mesh.

* * * * *